(12) United States Patent
Mizuta et al.

(10) Patent No.: US 12,218,072 B2
(45) Date of Patent: Feb. 4, 2025

(54) SEMICONDUCTOR DEVICE AND METHOD FOR MANUFACTURING THE SAME

(71) Applicant: Kioxia Corporation, Tokyo (JP)

(72) Inventors: Yoichi Mizuta, Yokohama Kanagawa (JP); Takahiro Tsurudo, Yokohama Kanagawa (JP); Yoshiaki Takahashi, Yokohama Kanagawa (JP); Kenichi Matoba, Yokohama Kanagawa (JP); Yoshifumi Shimamura, Yokohama Kanagawa (JP); Toru Ozawa, Kamakura Kanagawa (JP); Takumi Kosaki, Kamakura Kanagawa (JP); Kouji Nakao, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 440 days.

(21) Appl. No.: 17/412,022

(22) Filed: Aug. 25, 2021

(65) Prior Publication Data

US 2022/0285284 A1 Sep. 8, 2022

(30) Foreign Application Priority Data

Mar. 2, 2021 (JP) ................. 2021-032632

(51) Int. Cl.
*H01L 23/544* (2006.01)
*H01L 21/66* (2006.01)
*H01L 21/768* (2006.01)
*H01L 23/522* (2006.01)
*H01L 23/528* (2006.01)

(52) U.S. Cl.
CPC .......... *H01L 23/544* (2013.01); *H01L 21/768* (2013.01); *H01L 22/12* (2013.01); *H01L 23/5226* (2013.01); *H01L 23/528* (2013.01); *H01L 22/32* (2013.01); *H01L 2223/54426* (2013.01); *H01L 2223/54433* (2013.01)

(58) Field of Classification Search
CPC ......... H01L 2223/54433; H01L 23/544; H01L 23/528; H01L 23/5226; H01L 2223/54426; H01L 22/12
See application file for complete search history.

(56) References Cited

U.S. PATENT DOCUMENTS

2010/0102316 A1 4/2010 Xiao
2020/0266144 A1* 8/2020 Ichikawa ............... H10B 41/50

FOREIGN PATENT DOCUMENTS

| CN | 204407323 U | 6/2015 |
| JP | 2012-227283 | 11/2012 |
| TW | 202032757 A | 9/2020 |

* cited by examiner

*Primary Examiner* — Britt D Hanley
*Assistant Examiner* — Victor V Barzykin
(74) *Attorney, Agent, or Firm* — Foley & Lardner LLP

(57) ABSTRACT

According to one embodiment, a semiconductor device includes a circuit pattern including a plurality of unit patterns that are disposed in a repeating manner in at least one direction. The semiconductor device includes a discrimination pattern provided in the circuit pattern and configured to discriminate the unit patterns from each other.

12 Claims, 11 Drawing Sheets

FIG. 1A
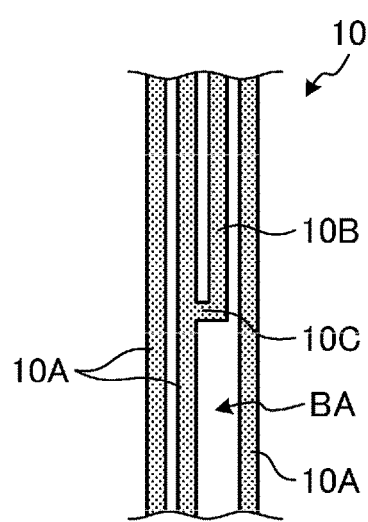
FIG. 1B
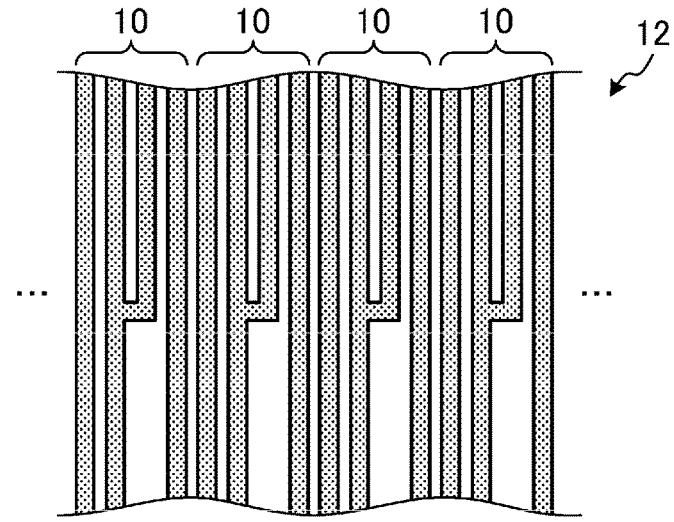
FIG. 1C
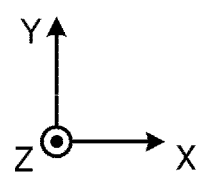
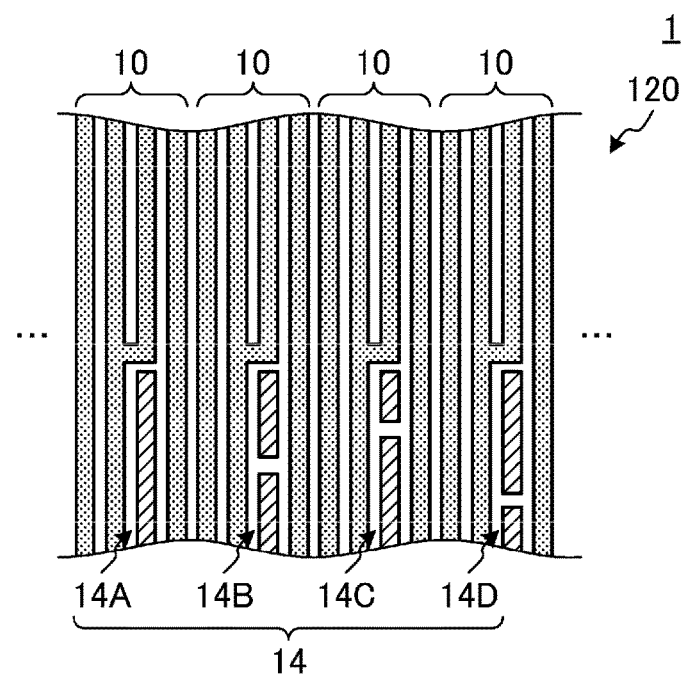

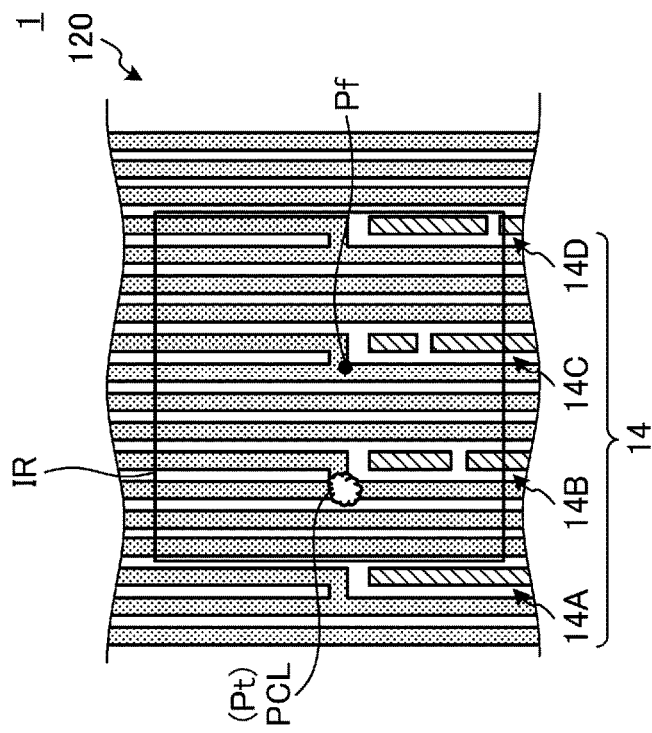
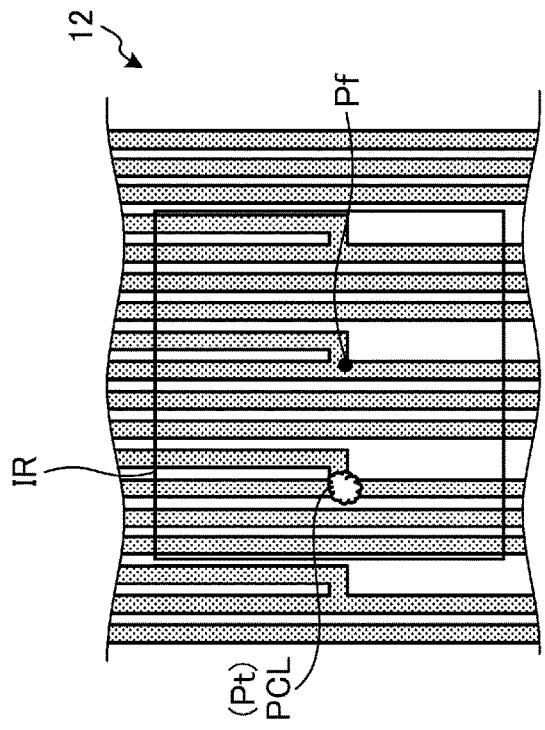

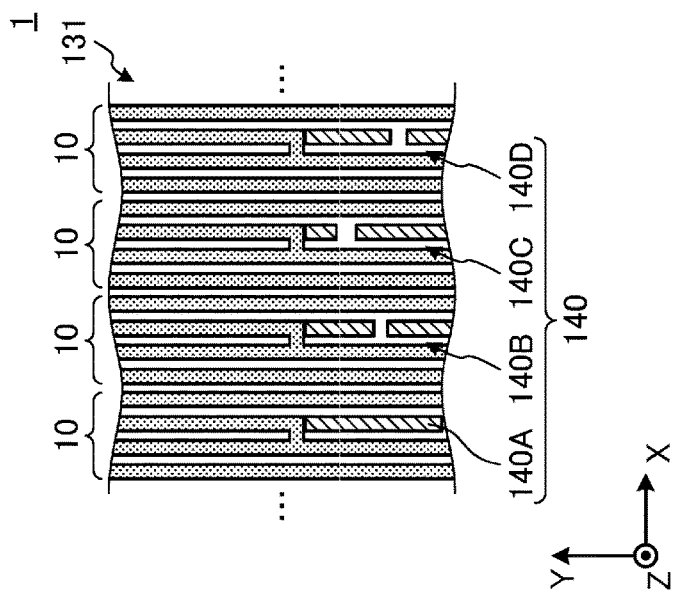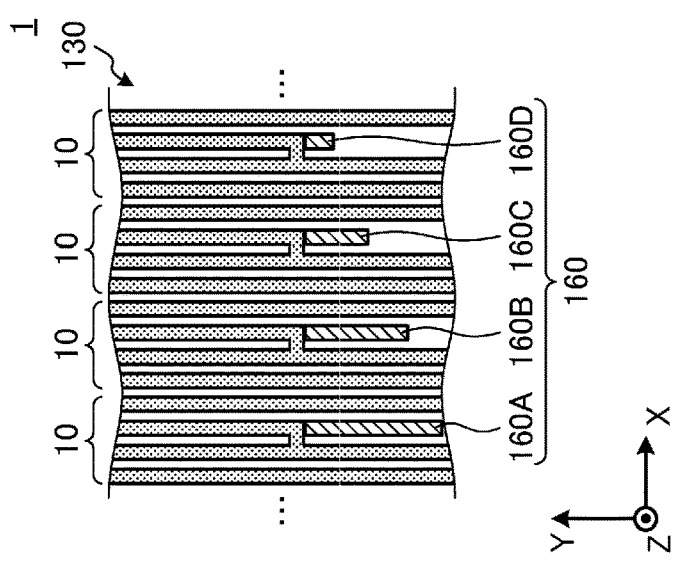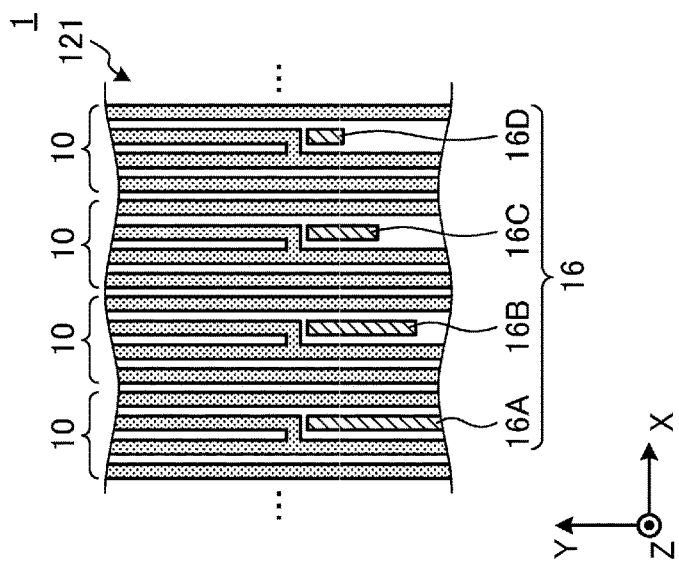

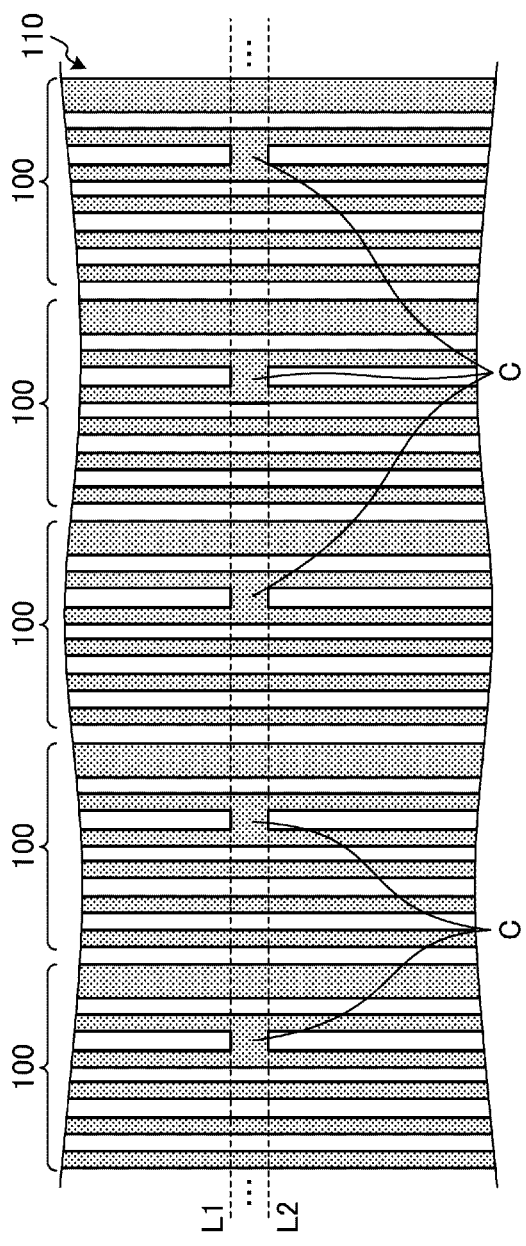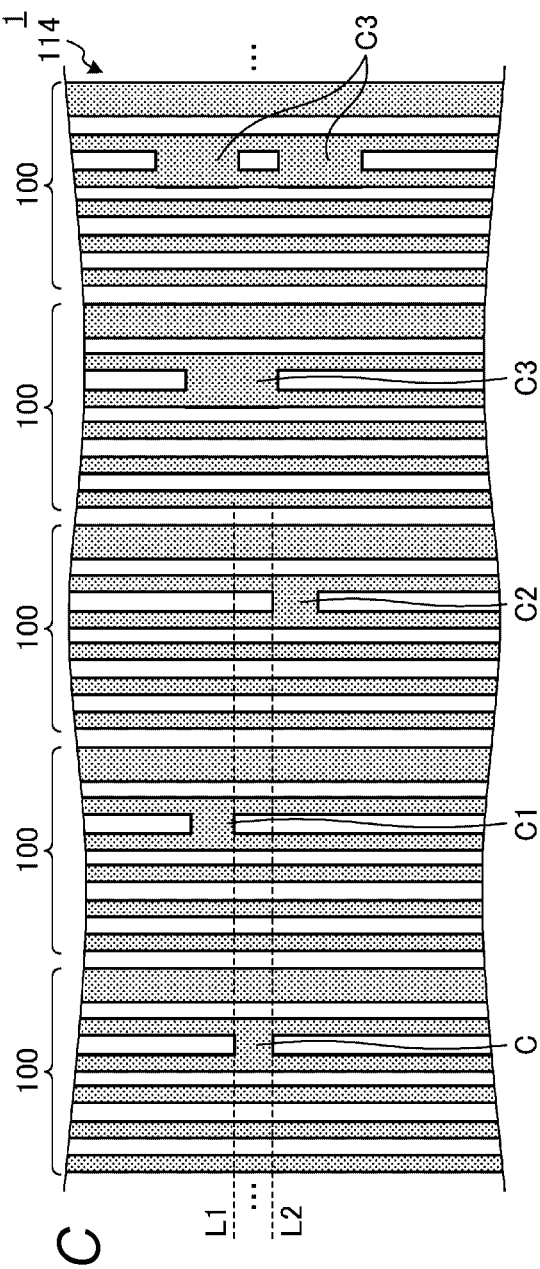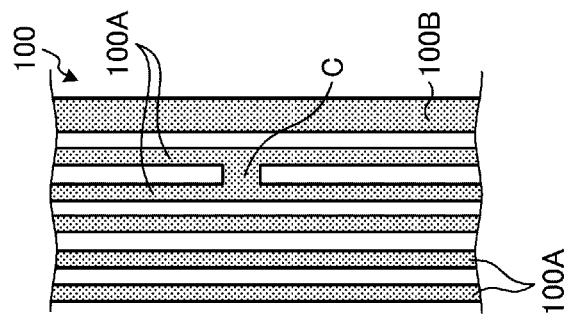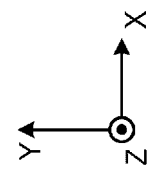

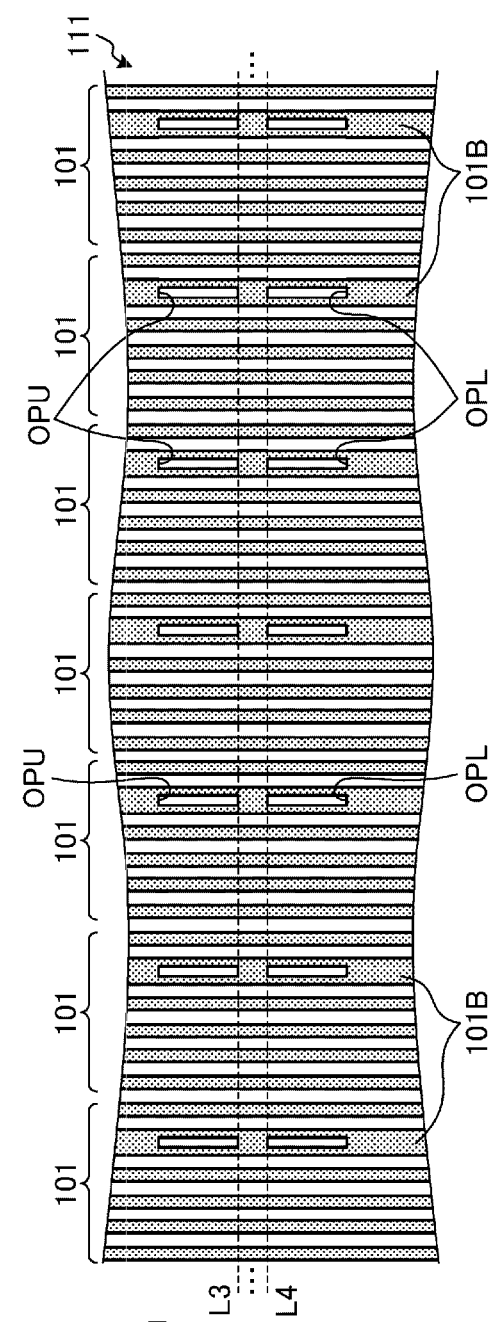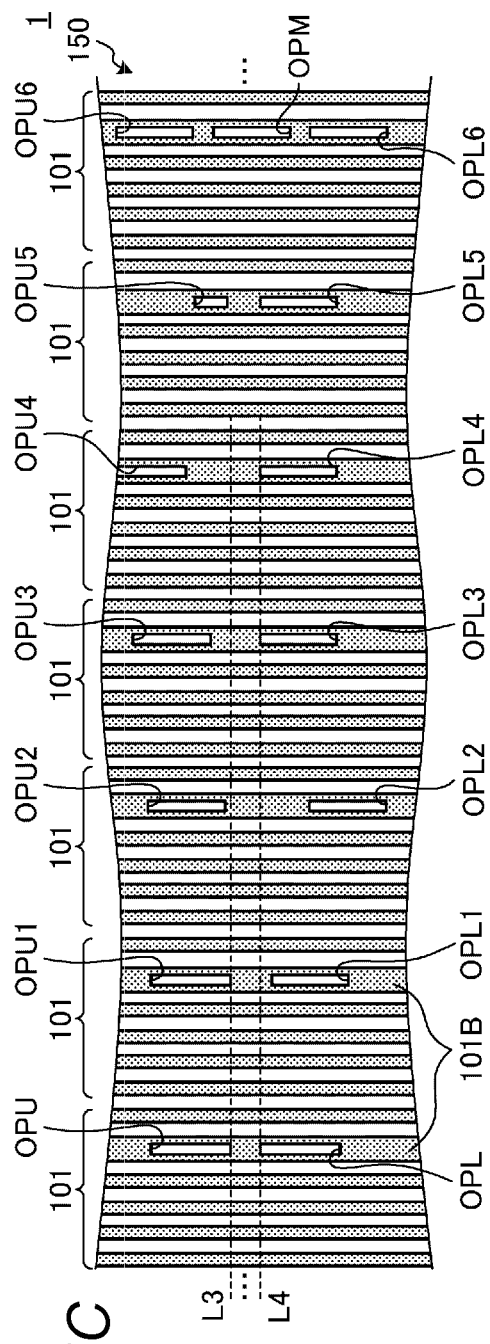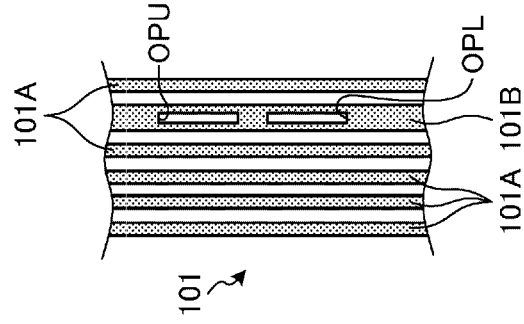

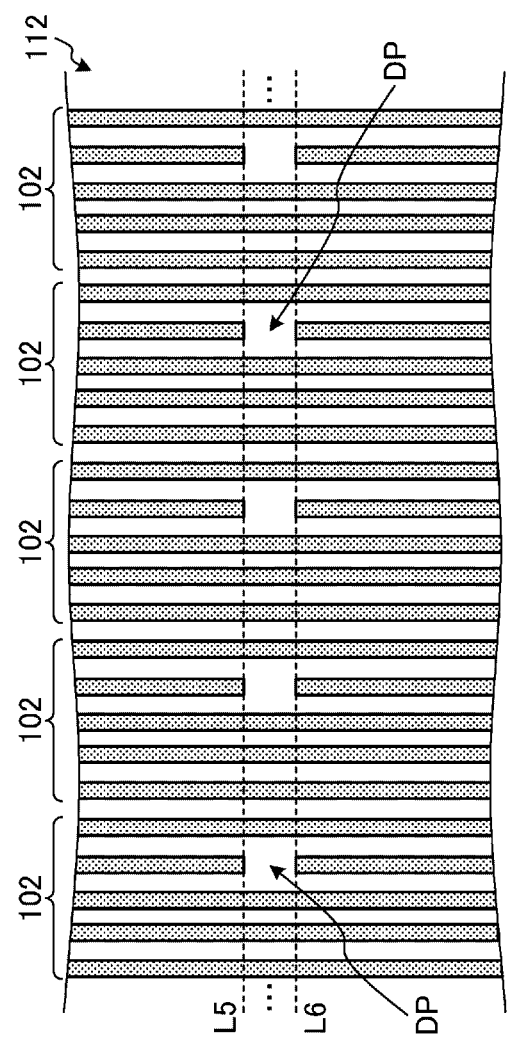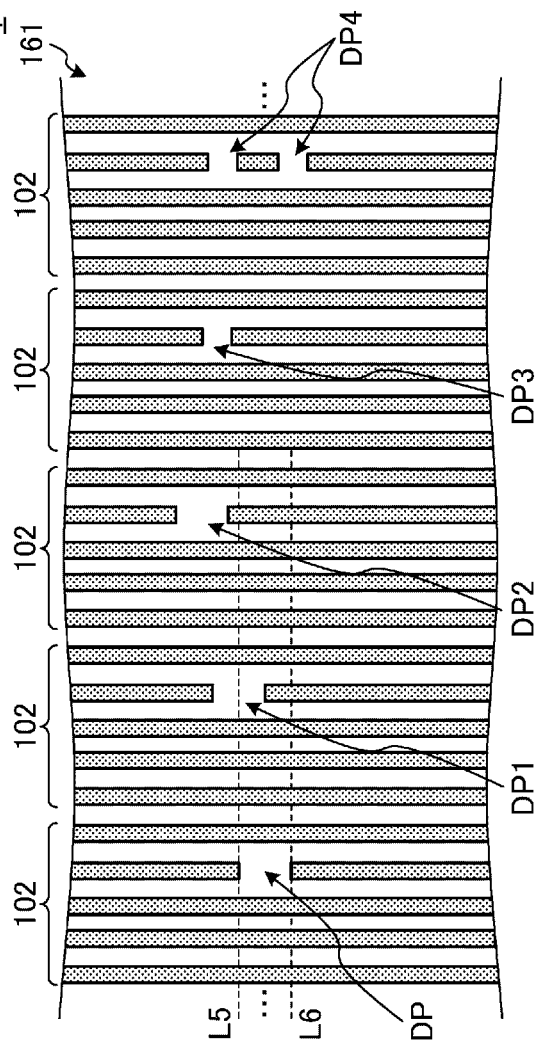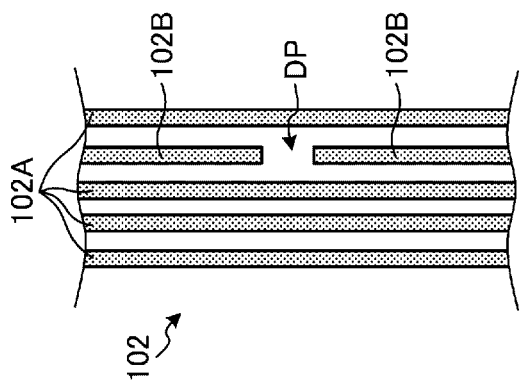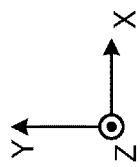

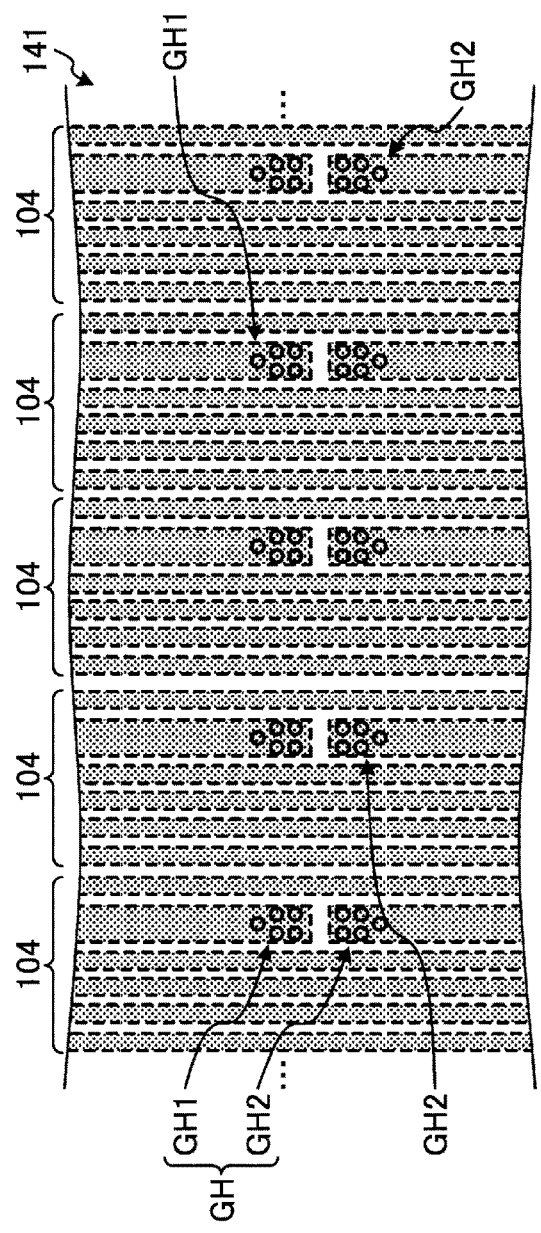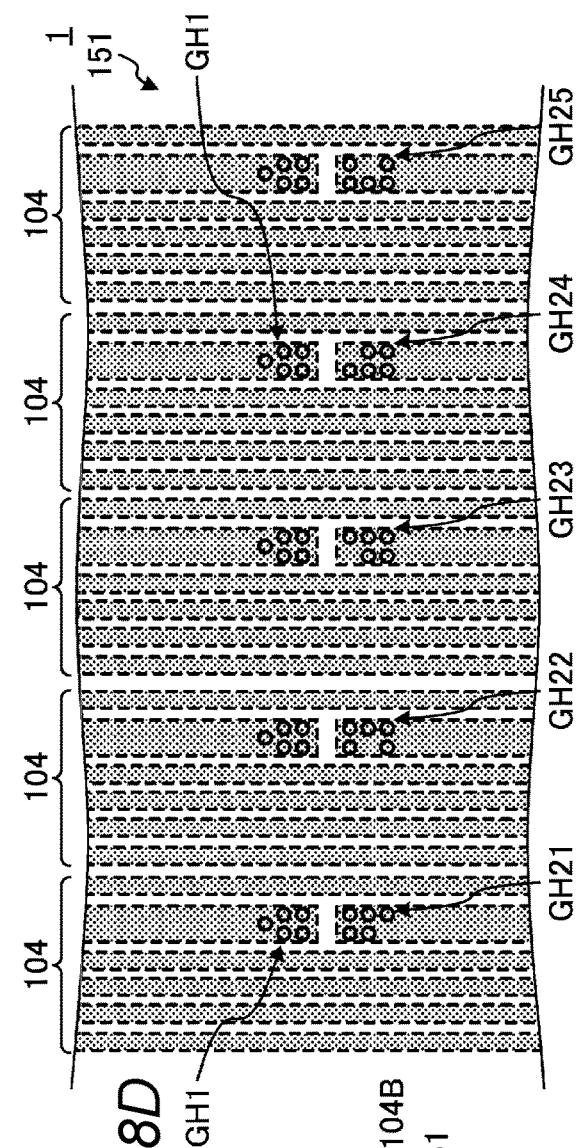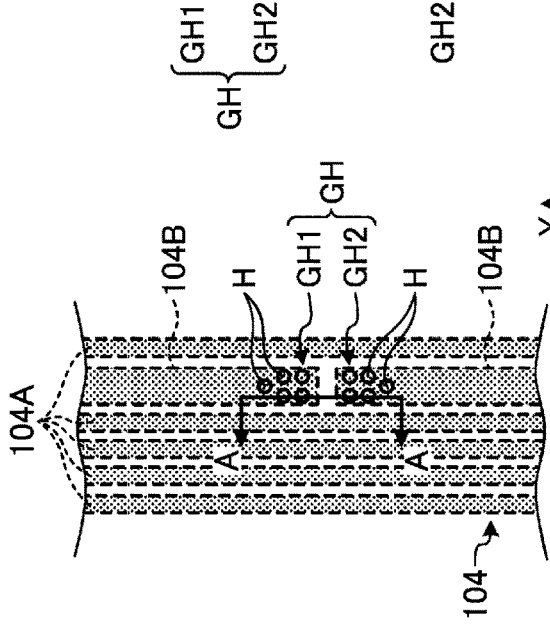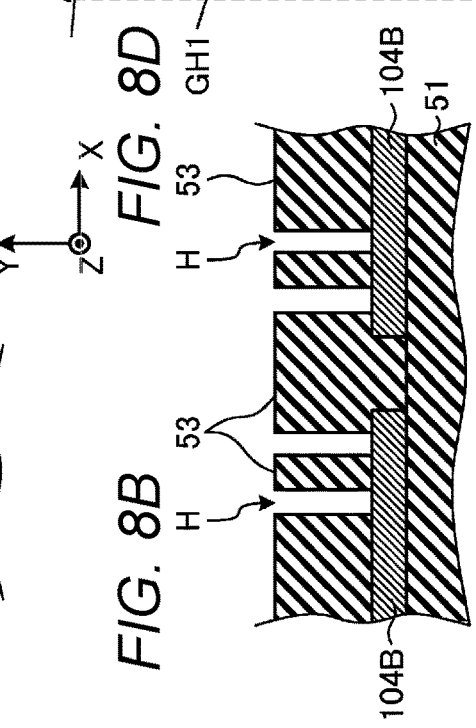

SEMICONDUCTOR DEVICE AND METHOD FOR MANUFACTURING THE SAME

CROSS-REFERENCE TO RELATED APPLICATION(S)

This application is based upon and claims the benefit of priority from Japanese Patent Application No. 2021-032632, filed on Mar. 2, 2021, the entire contents of which are incorporated herein by reference.

FIELD

Embodiments described herein relate generally to a semiconductor device, and a method for manufacturing the same.

BACKGROUND

A method for manufacturing a semiconductor device includes observing an interlayer insulating film including a groove or a hole for a wiring, a via, a contact, or the like, or observing a wiring layer including a wiring, in addition to forming a shape of a semiconductor device, such as etching, depositing, and the like. In the observation, for example, an optical microscope or a scanning electron microscope (SEM) is used to confirm the presence or absence of a manufacturing problem, such as the presence or absence of unintended scattering of particles. When a manufacturing problem is found, the position information can be desired for improving the product yield. However, when the same pattern is repeatedly formed on a substrate, it may be difficult to determine which part of the design data the image acquired by the observation corresponds to.

DESCRIPTION OF THE DRAWINGS

FIGS. 1A to 1C are views illustrating a circuit pattern in which a unit pattern is repeatedly formed provided in a semiconductor device according to an embodiment.

FIGS. 2A and 2B are views illustrating effect of a circuit pattern of the semiconductor device according to the embodiment.

FIGS. 3A to 3C are top views schematically illustrating a circuit pattern according to Modification.

FIGS. 4A to 4C are top views schematically illustrating a circuit pattern according to another Modification.

FIGS. 5A to 5C are top views schematically illustrating a circuit pattern according to another Modification.

FIGS. 6A to 6C are top views schematically illustrating a circuit pattern according to another Modification.

FIGS. 8A to 8D are views illustrating a circuit pattern according to yet another Modification.

DETAILED DESCRIPTION

Figure 7:
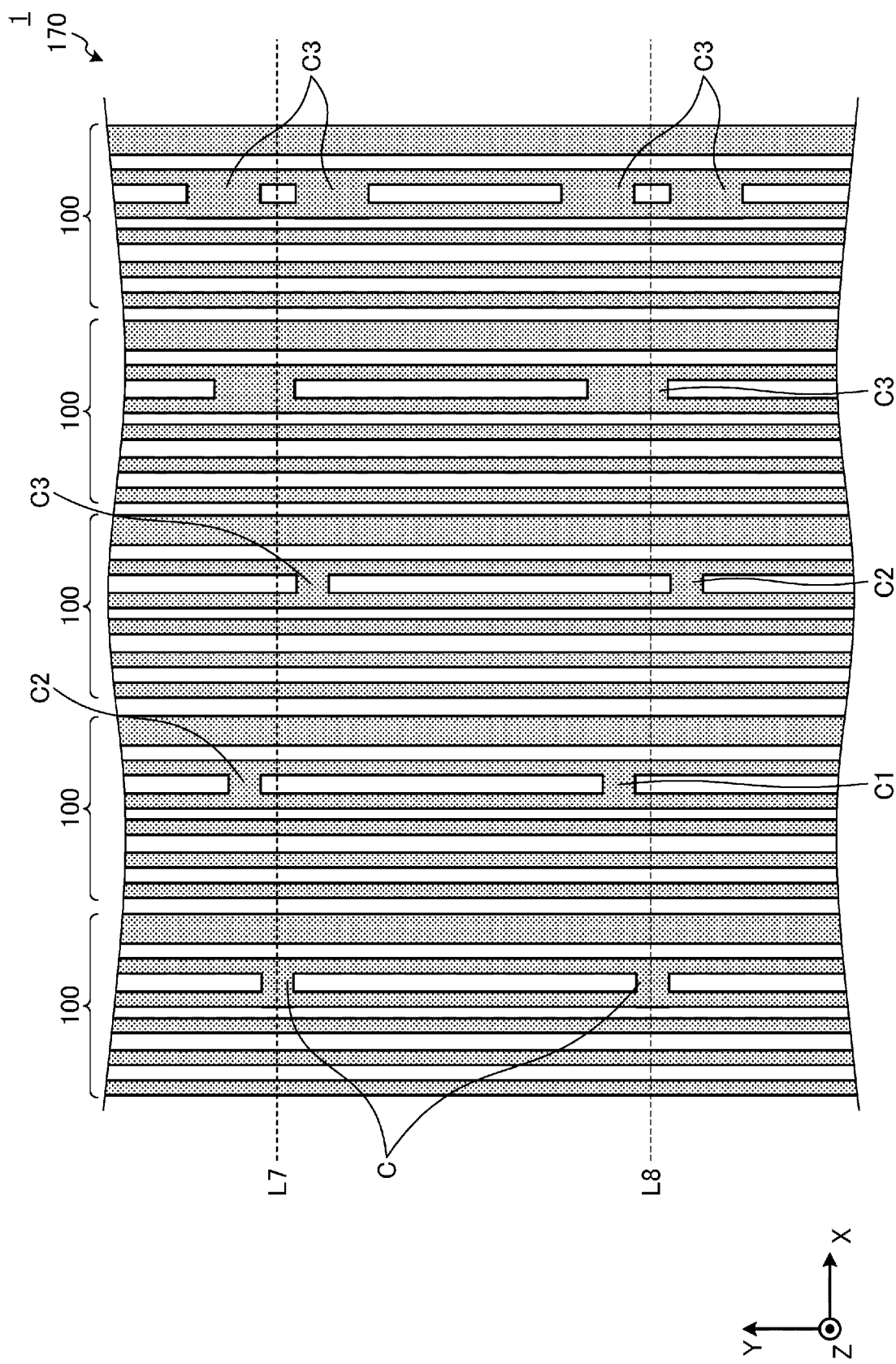
FIG. 7 is a top view schematically illustrating a circuit pattern according to another Modification.

Embodiments provide a semiconductor device and a method for manufacturing the same, which enable to easily correspond and associate the position on the observed image and the position on the design data.

In general, according to one embodiment, a semiconductor device includes a circuit pattern including a plurality of unit patterns that are disposed in a repeating manner in at least one direction. The semiconductor device includes a discrimination pattern provided in the circuit pattern and configured to discriminate the unit patterns from each other.

Hereinafter, a non-limiting embodiment of the present disclosure will be described with reference to accompanying drawings. In the entire drawings, the same or corresponding members or components are designated by the same or corresponding reference numerals, and overlapping descriptions will be omitted. Further, the drawings are not intended to show relative ratios between members or components. Therefore, a specific thickness or dimension may be determined by one of ordinary skill in the art in light of the following non-limiting embodiments.

An example of a circuit pattern provided in a semiconductor device according to an embodiment will be described with reference to FIGS. 1A to 1C. The semiconductor device in the embodiment may be, for example, a semiconductor storage device, but the present disclosure is not limited thereto. Further, a circuit pattern in which a plurality of unit patterns having the same shape in one direction is used as an example of the circuit pattern. The circuit pattern in the embodiment targets a figure that appears in an observed image when the observed image is acquired in a manufacturing step of the semiconductor device. Therefore, the observed image is assumed to be an image acquired from an upper surface of the semiconductor substrate. Further, since both the shape of a wiring connected to an element in the circuit diagram, and the shape of a wiring that is not connected to an element in the circuit diagram are appeared in the observed image, they are the targets of the circuit pattern. Further, as described later, the circuit pattern is not limited to a wiring, and may be a groove or a hole appeared in the observed image. Examples of circuits or semiconductor devices in which such circuit pattern is formed will be described later.

FIG. 1A is a top view schematically illustrating a unit pattern, and FIG. 1B is a top view schematically illustrating a circuit pattern formed by a plurality of unit patterns, and FIG. 1C is a top view schematically illustrating a circuit pattern provided in the semiconductor device 1 according to the embodiment. A unit pattern, a circuit pattern, and a discrimination pattern include, for example, a wiring formed of a conductive material such as metal or conductive polycrystalline silicon on an insulating film. In other words, the unit pattern, the circuit pattern, and the discrimination pattern may each correspond to a wiring (structure) formed in the same layer in the semiconductor device 1.

As illustrated in FIG. 1B, a unit pattern 10 illustrated in FIG. 1A is repeatedly arranged in the X direction to form a circuit pattern 12. The unit pattern 10 may be, for example, a wiring pattern formed in one column (or row) in the semiconductor device 1 according to the embodiment as a semiconductor storage device. In the illustrated example, the unit pattern 10 includes a plurality of lines 10A extending in the Y direction, a line 10B extending in the Y direction in the same manner and shorter than the line 10A, and a connection portion 10C that connects the line 10B to the line 10A. The unit pattern 10 is formed, for example, in one column (or row) and the column (or row) is repeatedly provided. The unit pattern 10 is repeatedly disposed to form the circuit pattern 12.

As illustrated in FIG. 1C, a circuit pattern 120 in the embodiment includes a discrimination pattern 14 in addition to the circuit pattern 12. In the illustrated example, the discrimination pattern 14 has four types of discrimination FIGS. 14A, 14B, 14C, and 14D. The discrimination FIG. 14A is a line continuously extending in the Y direction, and the discrimination FIGS. 14B to 14D are a combination of a plurality of lines having different lengths in the Y direction. As described above, the discrimination FIGS. 14A to 14D have shapes different from each other, and thus, may be distinguished from each other. Further, the discrimination FIGS. 14A to 14D are sequentially provided in each blank area BA (see FIG. LA) in the four unit patterns 10, and thus, arranged in the order along the X direction. Here, the blank area BA (or gap region) is an area in which a circuit element such as a line is not formed, and an insulating film that is in the same layer as the base layer of the wiring layer that constitutes the circuit pattern or the wiring layer that constitutes the circuit pattern is exposed in a relatively wide range. Further, although not illustrated, the unit pattern 10 is repeatedly disposed on the left side and the right side in the drawing, and for those unit patterns 10, the discrimination FIGS. 14A to 14D are periodically arranged in the order along the X direction.

The circuit pattern 120 is generated in advance by design data, and the position of each of the unit pattern 10 and the discrimination FIGS. 14A to 14D is specified by coordinates with a predetermined coordinate reference point (e.g., alignment mark) on the design data as the origin point. Further, the circuit pattern 120 may be formed by a single or multiple damascene method. For example, a trench or the like is formed in the insulating film by a photolithography step using a photomask produced based on the design data, the trench or the like is embedded with a conductive material such as metal, and the conductive material on the insulating film is removed by a chemical mechanical polishing (CMP) method. Further, a reactive ion etching (RIE) method may be used, in which the circuit pattern 120 is formed by a deposition step of a thin film of a conductive material such as metal or conductive polycrystalline silicon, a photolithography step using a photomask produced based on the design data, and an etching step.

The unit patterns 10 in the circuit pattern 12 do not have the same shape by including the discrimination FIGS. 14A to 14D, respectively. As a result, there is no circuit pattern in which a unit pattern having the same shape is not repeatedly arranged. Therefore, here, the circuit pattern in which a unit pattern having the same shape is repeatedly arranged is assumed to be a pattern in which the unit pattern is not able to be individually discriminated by a surface observation unit unless there is a discrimination pattern that enables the discrimination of the unit pattern.

Further, the shape of the unit patterns 10 in the circuit pattern 12 may be uniform within a range of error in the manufacturing process. In the drawing, for example, the discrimination FIGS. 14A to 14D have right-angled corners, but in practice, may have rounded corners, depending on the manufacturing process (etching).

Next, effect exerted by the circuit pattern 120 will be described with reference to FIGS. 2A and 2B. FIGS. 2A and 2B are views illustrating effect of the circuit pattern 120 of the semiconductor device 1 according to the embodiment. Specifically, FIG. 2A is a top view schematically illustrating a semiconductor substrate having a circuit patter 12 as a comparative example, and FIG. 2B is a top view schematically illustrating a semiconductor substrate having the circuit pattern 120. FIGS. 2A and 2B illustrate an imaging range (field of view) IR when the circuit patterns 12 and 120 are imaged by a scanning electron microscope (SEM) as a surface observation unit. That is, the shape in the imaging range IR is acquired as a single image data.

When a particle PCL is detected as a result of observation of the circuit pattern 12 by a so-called die-to-die method using an SEM, as illustrated in FIG. 2A, an image of the circuit pattern 12 having the particle PCL is displayed in the image data of the SEM. At this time, even though the particle PCL is at a position Pt in practice, coordinate information by the die-to-die method may inform that "the particle PCL is at a position Pf." Such difference may occur due to an error associated with the movement of a stage holding the substrate as an object to be measured in the SEM. In this case, even when an attempt is made to specify the position of the position Pt on the design data at which the particle PCL actually exists, since the unit pattern 10 is repeated in the circuit pattern 12, it is not easy to determine which unit pattern 10 the position Pt exists in the vicinity of.

However, according to the embodiment, as illustrated in FIG. 2B, the circuit pattern 120 has the discrimination pattern 14, and the respective shapes of the discrimination FIGS. 14A to 14D are different from each other. Therefore, from the image data of the SEM, it is grasped that the discrimination FIG. 14B exists in the vicinity of the position Pt of the particle PCL. As a result, even when the coordinates of the position Pf of the particle indicated by the die-to-die method is deviated from the coordinates of the position Pt on the design data at which the particle PCL actually exists, it is possible to correct based on the coordinates of the discrimination FIG. 14B. Then, it is possible to specify the position of the particle PCL on the design data. That is, since the discrimination pattern 14 exists, the image data acquired by the SEM and design data are easily matched to each other, and the position of the particle PCL on the design data can be obtained.

The number of types of the discrimination figures does not have to be equal to the number of repetitions of the unit pattern 10. For example, the discrimination figure may be assigned at internals of every other, every two, or more, instead of assigning the discrimination figure to each of the unit patterns 10. Therefore, the number of types of the discrimination figures to be prepared may be reduced, and also, it is possible to make the shapes of the respective discrimination figures clearly different from each other.

Further, the number of types of the discrimination figures to be prepared may be determined based on the number of the unit patterns grasped in the entire SEM image in a predetermined imaging range or imaging magnification. For example, when a width of each unit pattern (repetition pitch) that is repeatedly disposed in the X direction is 400 nm, and a width of imaging range IR of the SEM corresponds to 9 μm on the substrate, 22 unit patterns 10 may be grasped in the SEM image. At this time, 22 types of discrimination figures having different shapes may be prepared and assigned to the 22 unit patterns 10, respectively. In this case, the 22 types of discrimination figures having different shapes are periodically arranged and every unit pattern 10 has the discrimination figure (i.e., at a ratio of 1). In another example, 11 types of discrimination figures having different shapes may be prepared and assigned to every other unit pattern 10, and 22 unit patterns 10 to which the discrimination figure is assigned at intervals of every other may be periodically arranged (i.e., at a ratio of 1/2). In yet another example, 8 types of different discrimination figures having different shapes may be prepared and assigned to every two unit patterns 10, and 22 unit patterns 10 to which the discrimination figure is assigned at intervals of every two may be periodically arranged (i.e., at a ratio of 8/22). Further, the discrimination figure may be provided in the unit patterns 10 at intervals of every three or more.

Further, the number of types of the discrimination figures to be prepared may be determined in consideration of the position error (difference between the position Pt and the position Pf in the above-described example) that may occur in the die-to-die method. The position error that may occur in the die-to-die method may be considered to be, for example, 0.5 µm to 2 µm. However, if the position error is 1.5 µm and the width of the unit pattern 10 is 400 nm, three types of discrimination figures may be prepared. Therefore, the position of the discrimination figure in the vicinity of the position Pf indicated by the die-to-die method may be grasped, and thus, the actual position Pt may be specified. In the same manner, when the position error is 1.5 µm and the repetition pitch is 80 nm, 13 types of discrimination figures may be prepared, and when the repetition pitch is 40 nm, 25 types of discrimination figures may be prepared. Further, when the position error is 1.5 µm and the discrimination figure is arranged at intervals that is smaller than the position error and larger than half of the position error, for example, at intervals of every 1 µm, it is possible to correct the position Pf of the particle PCL indicated by the die-to-die method and to specify the actual position Pt.

It may be considered that the imaging magnification of the SEM differs depending on the width of the circuit pattern 12, the line width, and the pitch. When the imaging magnification of the SEM is different, the imaging range IR, the position error that may occur, or the number of unit patterns 10 observed in the imaging range IR are different. Therefore, the imaging magnification or resolution (resolving power) may be considered in determining the type or arrangement of the discrimination figure.

(Modification)

Subsequently, Modification of the circuit pattern will be described with reference to FIGS. 3A to 3C. FIGS. 3A to 3C are top views schematically illustrating a circuit pattern according to Modification.

Referring to FIG. 3A, a circuit pattern 121 includes the unit pattern 10 repeatedly disposed in the X direction and a discrimination pattern 16. The discrimination pattern 16 has discrimination FIGS. 16A, 16B, 16C and 16D, and the discrimination FIGS. 16A to 16D are provided corresponding to the unit pattern 10. The discrimination FIGS. 16A to 16D have line shapes each having different lengths, and are disposed apart from the lines 10A and 10B of the unit pattern 10 in the blank area BA (see FIG. LA) in the unit pattern 10. Since the lengths are different from each other, it is possible to distinguish the discrimination FIGS. 16A to 16D, and thus, it is possible to discriminate the unit patterns 10 in which the discrimination FIGS. 16A to 16D are disposed, respectively.

Referring to FIG. 3B, a circuit pattern 130 includes the unit pattern 10 repeatedly disposed in the X direction and a discrimination pattern 160. The discrimination pattern 160 has discrimination FIGS. 160A, 160B, 160C and 160D, and the discrimination FIGS. 160A to 160D are provided corresponding to the unit pattern 10. Similar to the discrimination FIGS. 16A to 16D illustrated in FIG. 3A, the discrimination FIGS. 160A to 160D have line shapes each having different lengths, and disposed in the blank area BA (see FIG. 1A) in the unit pattern 10. However, the discrimination FIGS. 160A to 160D are different from the discrimination FIG. 16A to 16D in that the discrimination FIGS. 160A to 160D are connected to the line 10B of the unit pattern 10. As described above, it is possible to distinguish the discrimination FIGS. 160A to 160D from the difference in length even when connected to the unit pattern 10, and thus, it is also possible to discriminate the unit patterns 10 in which the discrimination FIGS. 160A to 160D are disposed, respectively. When the discrimination FIGS. 160A to 160D are connected to the unit pattern 10, which serves as a wiring pattern, for example, the circuit constant such as stray capacitance may become uneven, and furthermore, ununiformity may occur in an operation of the semiconductor device. Therefore, the discrimination FIGS. 160A to 160D may be used when the influence due to the unevenness of, for example, the circuit constant is small.

As illustrated in FIG. 3C, a circuit pattern 131 includes the unit pattern 10 repeatedly disposed in the X direction and a discrimination pattern 140. The discrimination pattern 140 has discrimination FIGS. 140A, 140B, 140C, and 140D, and they have the same shapes as the discrimination FIGS. 14A to 14D illustrated in FIG. 1C, respectively. However, while the discrimination FIGS. 14A to 14D are apart from the unit patterns 10, the discrimination FIGS. 140A to 140D are connected to the unit patterns 10. Even in this case, the discrimination FIGS. 140A to 140D may be distinguished from each other since they have different shapes, and thus, the unit patterns 10 to which the discrimination FIGS. 140A to 140D are assigned may also be distinguished from each other. Further, similar to the discrimination FIGS. 160A to 160D illustrated in FIG. 3B, the discrimination FIGS. 140A to 140D are useful when the influence due to the unevenness of, for example, the circuit constant is small.

Subsequently, another Modification of the circuit pattern will be described with reference to FIGS. 4A to 6C. In the circuit patterns 120, 121, 130, and 131 that have already been described, the unit patterns 10 that are repeatedly disposed are assigned by the discrimination patterns 14, 16, 140, and 160 that are separated from the unit pattern 10, respectively. However, in the following Modification, the unit pattern 10 is modified to form a discrimination pattern.

As illustrated in FIG. 4A, a unit pattern 100 has a plurality of lines 100A extending in the Y direction, and a line 100B having a width (length in the X direction) larger than that of the line 100A. Further, a connection portion C is provided in the unit pattern 100, and two lines 100A are connected to each other by the connection portion C. That is, the two lines 100A are electrically conductive with each other. When the unit pattern 100 is simply repeatedly arranged, a circuit pattern 110 illustrated in FIG. 4B is formed. As illustrated, in the circuit pattern 110, the connection portion C in each unit pattern 100 is disposed at the same position in the Y direction as illustrated by broken lines L1 and L2.

Meanwhile, in a circuit pattern 114 according to Modification, as illustrated in FIG. 4C, connection portions C, C1, C2, and C3 are provided. The connection portions C1 and C2 have substantially the same shape as that of the connection portion C, but are disposed at different positions in the Y direction with respect to the connection portion C, as can be seen from the relative positions with the broken lines L1 and L2 in FIG. 4C. Further, the connection portion C3 is longer in the Y direction than the connection portions C, C1, and C2. Further, in the unit pattern 100 at the right end in the drawing, two connection portions C3 are formed. The connection portions C to C3 in the circuit pattern 114 differ from each other in the position and/or the shape, and thus, it is possible to distinguish from each other. Therefore, the connection portions C to C3 may have the same function as the above-described discrimination FIG. 14A or the like. In other words, the discrimination pattern may be configured by the connection portions C to C3. That is, as described above, the discrimination pattern is obtained by changing the position or the shape of a part (connection portion in the illustrated example) of the unit pattern 100. It is needless to say that such changes may be made so as not to affect the characteristics of the semiconductor device.

Subsequently, referring to FIG. 5A, a unit pattern 101 has a plurality of lines 101A extending in the Y direction, and a line 101B having a width larger than that of the line 101A. Two openings OPL and OPU are formed in the line 101B. When the unit pattern 101 is simply repeatedly arranged, a circuit pattern 111 illustrated in FIG. 5B is formed. As illustrated, in the circuit pattern 111, the two openings OPL and OPU in each unit pattern 101 are disposed at the same position in the Y direction, respectively, as illustrated by broken lines L3 and L4.

Meanwhile, in a circuit pattern 150 according to Modification, the openings OPL and OPU are disposed in one unit pattern 101 (at the left end in FIG. 5C), but other openings are disposed in other unit patterns 101. Specifically, openings OPL1 and OPU1 are disposed in the line 101B of the second unit pattern 101 from the left in FIG. 5C, openings OPL2 and OPU2 are disposed in the line 101B of the third unit pattern 101 from the left, openings OPL3 and OPU3 are disposed in the line 101B of the fourth unit pattern 101 from the left, openings OPL4 and OPU4 are disposed in the line 101B of the fifth unit pattern 101 from the left, openings OPL5 and OPU5 are disposed in the line 101B of the sixth unit pattern 101 from the left, and an opening OPL6, an opening OPM, and an opening OPU6 are disposed in the line 101B of the rightmost unit pattern 101.

As can be seen from the broken line L3, while the opening OPU1 and the opening OPU2 are disposed at the same position in the Y direction with respect to the opening OPU, the opening OPL1 and the opening OPL2 are disposed to be offset to the lower side in the drawing, with respect to the opening OPL. Additionally, the opening OPL2 is largely offset to the lower side from the OPL1. As can be seen from the broken line L4, while the opening OPL3 and the opening OPL4 are disposed at the same position in the Y direction with respect to the opening OPL, the opening OPU3 and the opening OPU4 are disposed to be offset to the upper side in the drawing, with respect to the opening OPU. Additionally, the opening OPU4 is largely offset to the upper side from the OPU3. Due to the difference in arrangement as the above, the combination of the opening OPL and the opening OPU, and the combinations of the openings OPLx and the openings OPUx (x is an integer from 1 to 4) may be distinguished from each other.

Further, the lower end position of the opening OPU5 is the same as the lower end position of the opening OPU in the Y direction, but the upper end position thereof is offset to the lower side in the drawing from the upper end position of the opening OPU. That is, the opening OPU5 is shorter in the Y direction than the opening OPU. Therefore, it is also possible to distinguish the combination of the opening OPL5 and the opening OPU5 with respect to the combination of the above-described openings. The combination of the opening OPL6, the opening OPM, and the opening OPU6 may also be distinguished from other combinations. That is, due to the difference in the shape and/or the position, the combinations of the openings may have the same function as the above-described discrimination FIG. 14A or the like, and the discrimination pattern is configured by the combinations of the openings.

Further, referring to FIG. 6A, a unit pattern 102 has a plurality of lines 102A extending in the Y direction, and two lines 102B. The lines 102B face each other via the dividing portion DP, and extend in the Y direction together. When the unit pattern 102 is simply repeatedly arranged, a circuit pattern 112 illustrated in FIG. 6B is formed. As illustrated, in the circuit pattern 112, the dividing portion DP in each unit pattern 102 is disposed at the same position in the Y direction as illustrated by broken lines L5 and L6.

Meanwhile, in a circuit pattern 161 according to Modification, as illustrated in FIG. 6C, dividing portions DP, DP1, DP2, DP3, and DP4 are provided. The dividing portions DP1 and DP2 have substantially the same length as that of the dividing portion DP along the Y direction, but are disposed at different positions in the Y direction with respect to the dividing portion DP, as can be seen from the relative positions with the broken lines L5 and L6 in FIG. 6C. Further, the dividing portion DP3 is shorter in the Y direction than the dividing portions DP, DP1, and DP2. Further, in the unit pattern 100 at the right end in the drawing, two dividing portions DP4 are formed. The dividing portions DP to DP4 in the circuit pattern 161 differ from each other in the position and/or the shape, and thus, it is possible to distinguish from each other. Therefore, the dividing portions DP to DP4 may have the same function as the above-described discrimination FIG. 14A or the like, and the discrimination pattern is configured by the dividing portions DP to DP4.

Although the unit pattern repeatedly disposed in the X direction has been focused on, a unit pattern extending in the Y direction may be repeatedly disposed in the X direction. In this case, as illustrated in FIG. 7, a series of discrimination pattern may be disposed at predetermined intervals in the Y direction. FIG. 7 is a top view schematically illustrating a circuit pattern when the unit pattern 100 illustrated in FIG. 4A extends relatively long in the Y direction. As illustrated, a circuit pattern 170 is provided with two columns of connection portions C, C1, C2, and C3 that are periodically arranged, respectively, substantially along broken lines L7 and L8 extending in the X direction. Here, the interval between the two columns (interval between the broken lines L7 and L8) may be determined in consideration of, for example, the imaging range IR by the SEM, or the position error by the die-to-die method.

(Other Modification)

Until now, the case where the unit pattern formed by wirings is repeatedly disposed has been described. However, but the present disclosure is not limited thereto, and the embodiment may be applied to a case where a unit pattern formed by a via or a penetrating contact is repeatedly disposed. Hereinafter, descriptions will be made on yet another Modification using a case where, for example, the unit pattern is formed by a via or a hole for penetrating contact provided in an insulating film, and the unit pattern is repeatedly disposed as an example, with reference to FIGS. 8A to 8D. FIGS. 8A to 8D are views illustrating a circuit pattern according to yet another Modification.

Referring to FIG. 8A, a wiring pattern 104 including wirings 104A, and wirings 104B having a width larger than that of the wiring 104A is formed. The wirings 104A and 104B may be formed of, for example, metal such as Cu or conductive polycrystalline silicon. As illustrated in FIG. 8B, which is a cross-sectional view taken along line A-A in FIG. 8A, the wiring 104B (the same applies to the wiring 104A) is formed on an insulating film 51 and an insulating film 53 is formed to cover them. That is, the wirings 104A and 104B are lower-layer wirings, and FIG. 8A illustrates the wirings 104A and 104B whose shapes may be visually recognized through the insulating film 53 depending on the material or the thickness of the insulating film 53.

As illustrated in FIGS. 8A and 8B, a plurality of holes H that penetrate the insulating film 53 and reach the wiring 104B are formed, and the wiring 104B is exposed at the bottom surface of the holes H. The holes H may be formed by, for example, a photolithography step and an etching step. Further, for example, metal such as Cu is embedded into the hole H later, and thus, a via (or contact) that is connected to the wiring 104B is formed.

As illustrated in FIG. 8A, a plurality of holes H are divided into two hole groups GH1 and GH2. The hole group GH1 includes five holes H, which are disposed in a substantially pentagonal shape. Specifically, three of the five holes H are disposed at vertices of an isosceles triangle with base side extending in the X direction. The remaining two are disposed at positions shifted in the Y direction with respect to the two holes H disposed at the vertices at both ends of the base side. The hole group GH2 also includes five holes H, which are disposed in a substantially pentagonal shape similar to the holes H in the hole group GH1. However, in the illustrated example, the holes H in the hole group GH1 and the holes H in the hole group GH2 are symmetrically disposed with respect to the X axis.

When a pair of hole groups GH1 and GH2 are set as a unit pattern GH (see FIG. 8A), and the unit pattern GH is repeatedly disposed in the X direction together with the wiring pattern 104 in the lower layer, as illustrated in FIG. 8C, a circuit pattern 141 is formed. In this case, since the unit pattern GH in which the holes H are arranged in the same manner is repeatedly arranged, similar to the circuit pattern 12 described with reference to FIGS. 2A and 2B, even when a defect such as a particle is observed on the insulating film 53, it is not easy to specify the position on the design data.

When observing a defect such as a particle on the insulating film 53, the wirings 104A and 104B may be recognized through the insulating film 53 depending on the material or the thickness of the insulating film 53. However, since the wiring pattern 104 including these is also repeatedly arranged, it is not easy to specify the position of the defect such as the particle on the design data from the positions of the wirings 104A and 104B. Further, for example, when the insulating film 53 is thick, the shapes of the wirings 104A and 104B may not be recognized.

Meanwhile, referring to FIG. 8D, in a circuit pattern 151 according to the Modification, instead of the hole group GH2 in FIG. 8C and the like, hole groups GH21, GH22, GH23, GH24, and GH25 are provided to make a pair with the hole group GH1. The hole groups GH21 to GH25 have five holes H similar to the hole group GH2, but have different arrangements. Specifically, in the hole groups GH21 to GH25, instead of the substantially pentagonal shape, the holes H are disposed at five locations excluding one location from the arrangement positions at six locations in a 2-by-3 matrix in the X-Y plane. Then, the position of the one location is different in each of the hole groups GH21 to GH25. More specifically, the one location at which the hole H is not disposed corresponds to the position of the first row-third column, first row-second column, first row-first column, second row-first column, and second row-second column in the hole groups GH21, GH22, GH23, GH24, and GH25, respectively. Due to difference in arrangement, the hole groups GH21 to GH25 may have the same function as the above-described discrimination FIG. 14A or the like, and it can be said that the discrimination pattern is configured by the variation of the unit pattern GH.

Further, as described above, since the wirings 104A and 104B are not easy to be clearly recognized through the insulating film 53, even if a predetermined discrimination pattern is given to the wirings 104A and 104B, it is also not easy to specify the position of the defect on the insulating film 53 on the design data by the discrimination pattern. With regard to this, in the case of the hole H, the wirings 104A and 104B exposed on the bottom surface may be clearly recognized by the SEM or the like, and thus, the position of the defect on the design data may be easily specified.

Since the number of the holes H is the same even though the arrangement is different as in each of the hole groups GH21 to GH25, the electrical resistance between the via formed by embedding the hole H with metal and the wiring 104B may be substantially the same in any arrangement. Further, although the hole groups GH1 and GH2 each having five holes H are illustrated, the number of the holes H is not limited to five, and may be appropriately determined in consideration of the imaging range or the imaging magnification in the observing device such as the SEM or the position error by the die-to-die method. Further, instead of the hole group GH2 illustrated in FIG. 8C, the hole groups GH21 to GH25 in which the arrangements of the holes H are different from each other are used. However, a plurality of hole groups in which the arrangements of the holes H are different from each other may be used instead of the hole group GH1. Furthermore, in FIG. 8D, for example, the hole group GH21 and the hole group GH1 may be exchanged in the Y direction (vertical direction in the drawing), and the hole group GH24 and the hole group GH1 may be exchanged in the Y direction. That is, the arrangement of the hole H may be changed in either (or both) of the hole group GH1 or the hole group GH2 included in the unit pattern GH in FIG. 8C.

Further, although the case where the hole H is formed on the insulating film 53, and then the defect or the like is observed (inspected) is described, after embedding metal (e.g., Cu) into the hole H to form the via or the like, the defect or the like may be observed. Even in this case, as described above, the position of the defect on the substrate may be specified on the design data based on the hole groups GH21 to GH25. Further, as described above, the circuit pattern 120 or the like is formed by embedding the trench or the like with a conductive material such as metal, but the defect or the like may be observed after forming the trench (groove) or the like before embedding the conductive material. That is, the circuit pattern, which is the observation target, is not limited to the wiring, the via, or the like, but may be a hole or a groove. In FIGS. 8A to 8D, the case where the material of the bottom surface of the hole is different from that of the interlayer insulating film is described. However, since the SEM image is excellent in observing the unevenness of the surface, it is possible to recognize the position of the hole or the opening on the SEM image even when the material of the bottom surface of the hole or the opening is the same as that of other regions.

Figure 9:
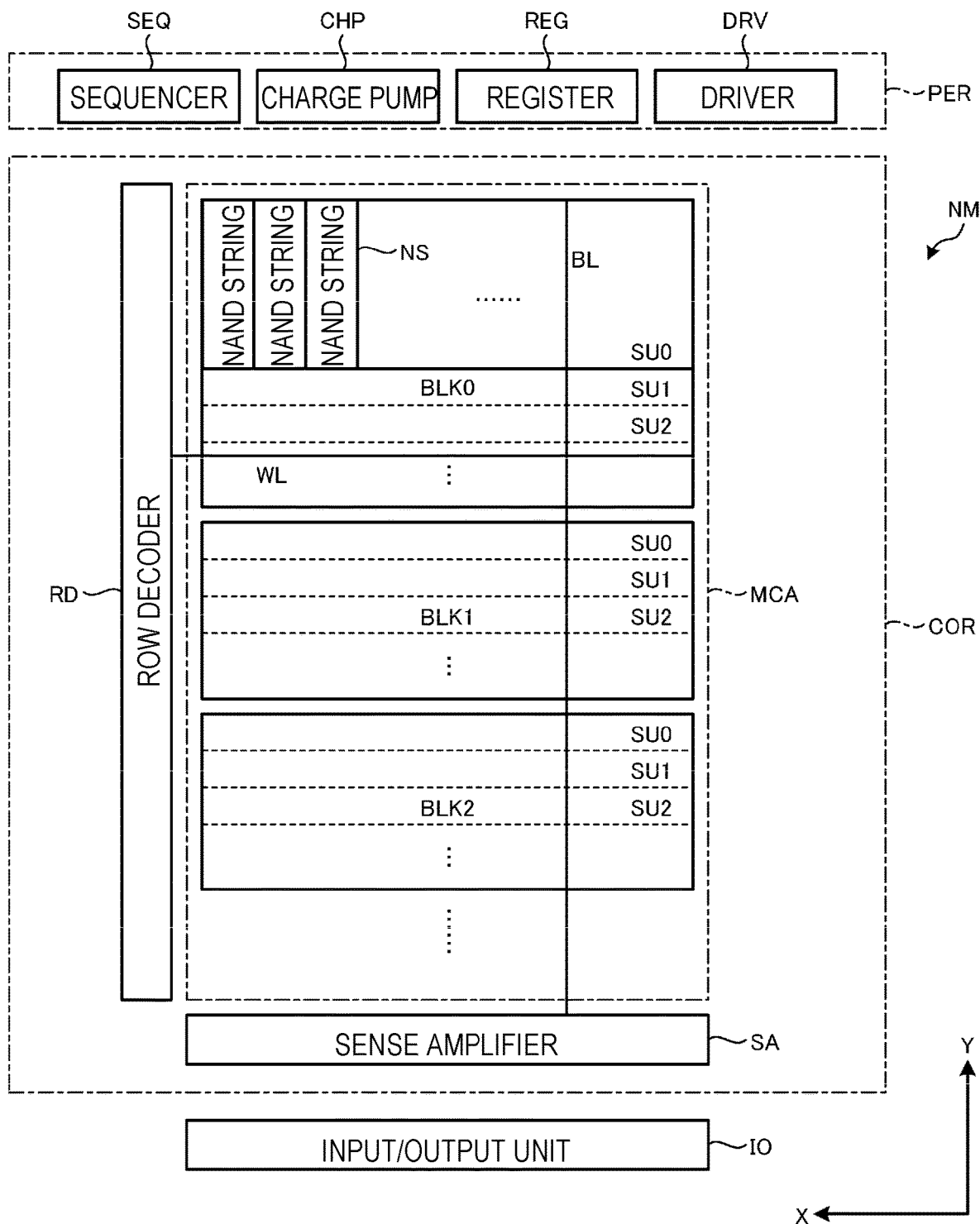
FIG. 9 is a block diagram schematically illustrating a configuration of a NAND memory.
Figure 10:
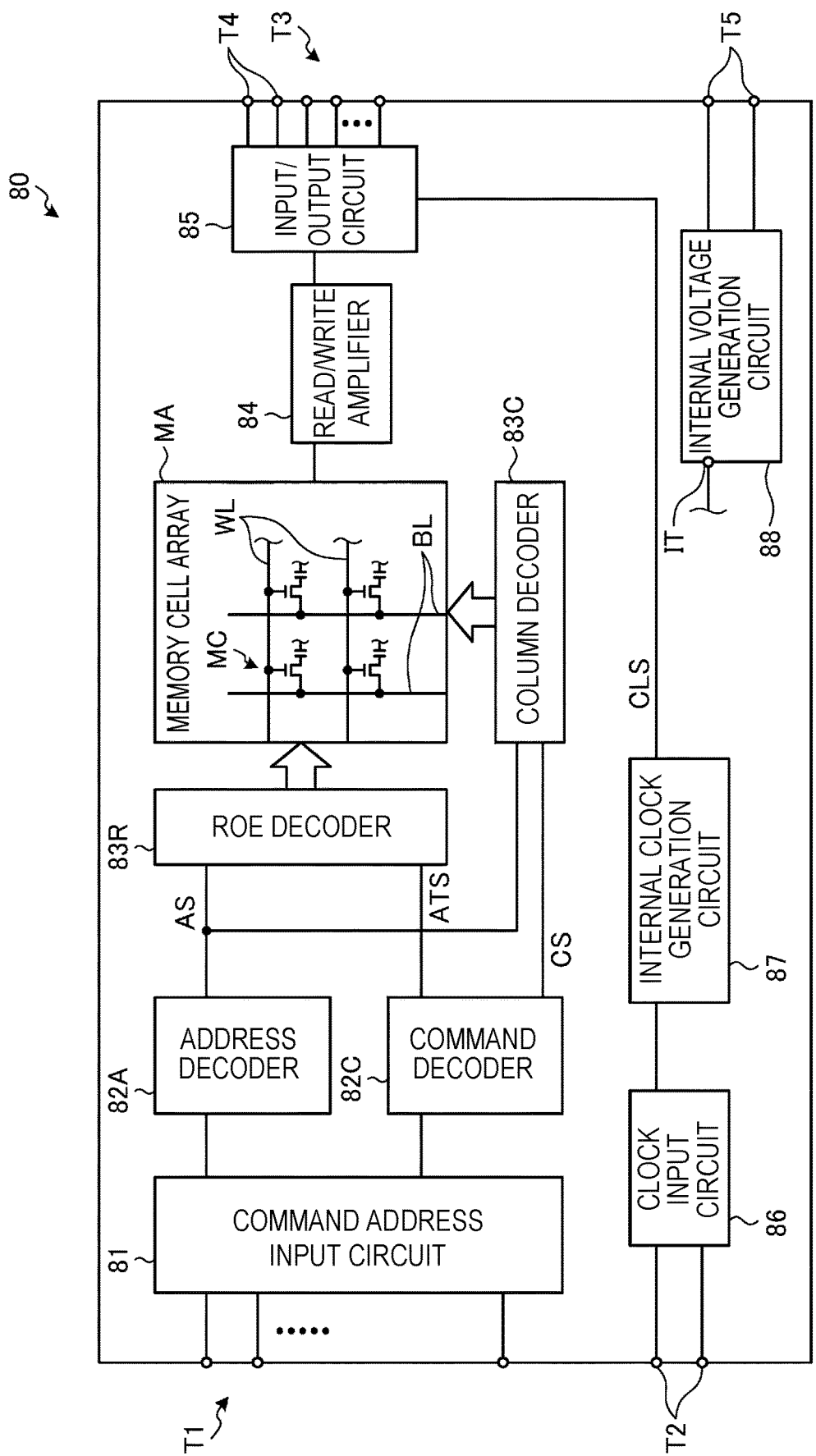
FIG. 10 is a block diagram schematically illustrating a configuration of a DRAM memory.
Figure 11:
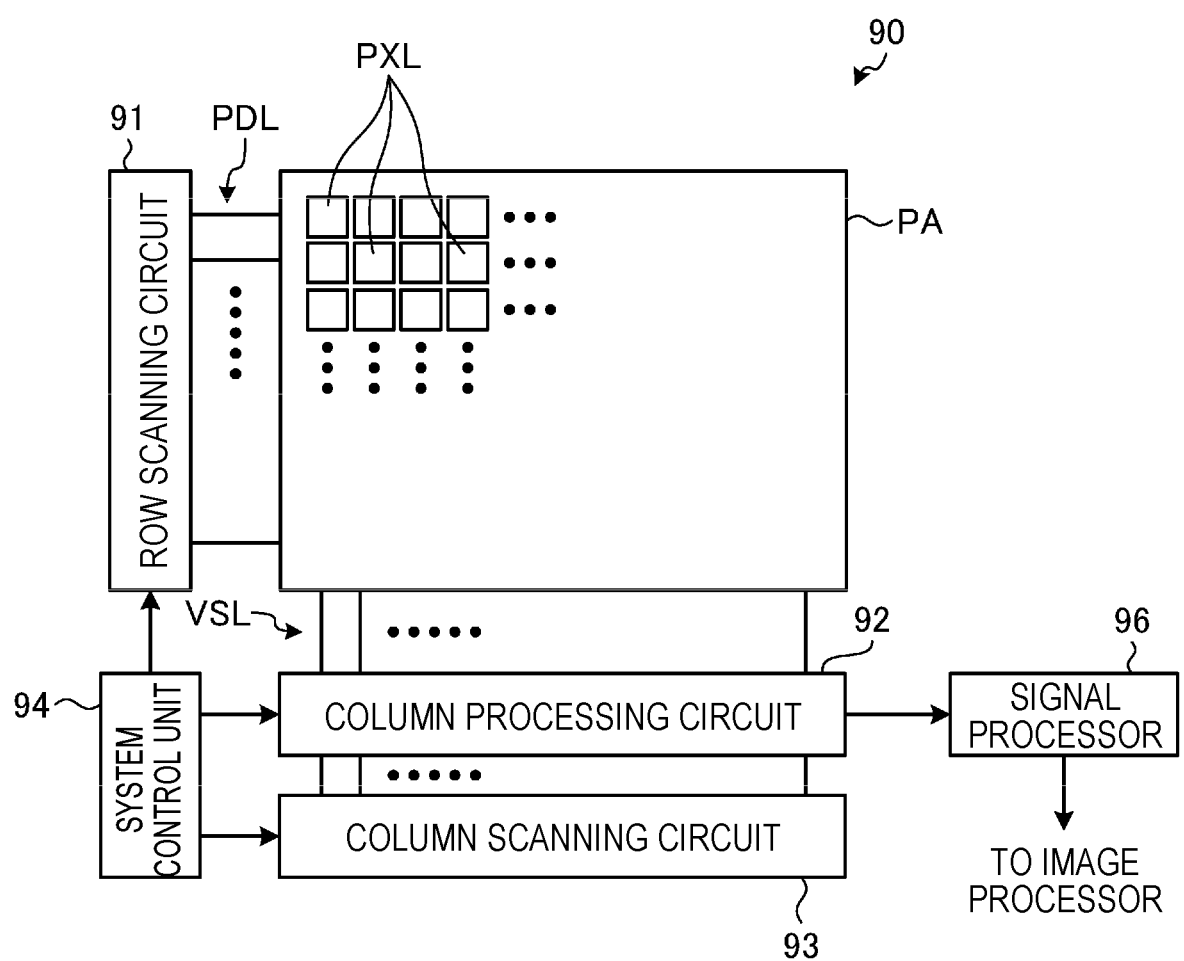
FIG. 11 is a block diagram schematically illustrating a configuration of an imaging element.

Next, descriptions will be made on a semiconductor device provided with a circuit pattern formed by repeatedly arranging a plurality of unit patterns having the same shape in one direction. FIG. 9 is a block diagram schematically illustrating a configuration of a NAND memory, FIG. 10 is a block diagram schematically illustrating a configuration of a DRAM memory, and FIG. 11 is a block diagram schematically illustrating a configuration of an imaging element.

Referring to FIG. 9, a NAND memory NM serving as a semiconductor storage device includes a core unit COR, an input/output unit IO, and a peripheral circuit PER. The core unit COR is provided with a memory cell array MCA, a row decoder RD, and a sense amplifier SA. The memory cell array MCA is provided with a plurality of blocks BLK (BLK0, BLK1, BLK2, . . . ) each including a plurality of memory cells. Specifically, each block BLK has a plurality of string units SU (SU0, SU1, SU2, . . . ). The string unit SU has a plurality of NAND strings NS. Memory cells are connected in series in the NAND string.

The memory cell array MCA is provided with a plurality of word lines WL and a plurality of bit lines BL (in drawing, single word line and single bit line are illustrated). The plurality of word lines WL extend in the X direction and are connected to the row decoder RD. Further, each of the plurality of word lines WL is commonly connected to the nth memory cell of the plurality of NAND strings NS of the individual string unit SU in the corresponding block BLK. Meanwhile, the plurality of bit lines BL extend in the Y direction and are connected to the sense amplifier SA. Further, one bit line BL of the plurality of bit lines BL is commonly connected to the mth NAND string NS between the plurality of blocks BLK. The memory cell is disposed at a point where each of the plurality of word lines WL and each of the plurality of bit lines BL intersect with each other.

The row decoder RD decodes a block address received from a predetermined control unit external to the NAND memory NM, and selects the block BLK and a word line WL in the block BLK. When reading data, the sense amplifier SA senses and amplifies the data read from the memory cell. Then, the read data is output to a predetermined control unit as necessary. Further, when programming the data, the write data received from a predetermined control unit is transferred to the memory cell.

The input/output unit IO sends/receives various commands or data to/from a predetermined control unit. The input/output unit IO includes, for example, data input/output terminals DQ0 to DQ7, toggle signal input/output terminals DQS, /DQS, external control terminals /CEn, CLE, ALE, /WE, RE, and /RE, and receives signals corresponding to these terminals from an external controller. The peripheral circuit PER includes a sequencer SEQ, a charge pump CHP, a register REG, and a driver DRV. The driver DRV supplies a voltage required for programming, reading, and erasing the data to the row decoder RD or the sense amplifier SA. This voltage is applied to various wirings in the memory cell array MCA. The charge pump CHP boosts a power supply voltage supplied from the outside and supplies the required voltage to the driver DRV. The register REG holds various signals. For example, the register REG holds a status of a data program or an erase operation, and notifies a predetermined control unit whether or not the operation is completed normally. The sequencer SEQ controls the operation of the entire NAND memory NM.

In the NAND memory NM described above, various circuit elements such as transistors that constitute the memory cell, the word lines WL, or the bit lines BL are periodically disposed in the memory cell array MCA in the same circuit layout. As a result, also in the row decoder RD to which each word line WL is connected, a unit pattern having the same shape by a plurality of word lines WL or other wirings is formed to be repeatedly arranged in one direction. The same applies to the sense amplifier SA to which a plurality of bit lines BL is connected. The above-described circuit pattern 120 or the like may be applied to such row decoder RD or the sense amplifier SA.

Next, referring to FIG. 10, a DRAM memory 80, which serves as a semiconductor storage device, includes a memory cell array MA. The memory cell array MA includes a plurality of word lines WL and a plurality of bit lines BL, and a memory cell MC is disposed at points where the word lines and the bit lines intersect with each other. The word line WL is selected by a row decoder 83R and the bit line BL is selected by a column decoder 83C. Further, the DRAM memory 80 is provided with a command address terminal T1, a clock terminal T2, a data terminal T3, and power supply terminals T4 and T5. Clock signals CK, /CK are input to the clock terminal T2. The power supply voltage is supplied to the power supply terminal T5, and the power supply voltage is further supplied to an internal voltage generation circuit 88. The internal voltage generation circuit 88 generates various internal voltages based on the power supply voltage, and outputs from a terminal IT to each unit. In FIG. 10, a refresh circuit or the like provided in the DRAM memory is omitted for convenience of description.

An address signal and a command signal from outside are input to the command address terminal T1. The address signal input to the command address terminal T1 is supplied to an address decoder 82A via a command address input circuit 81. The address decoder 82A supplies an address signal AS to the row decoder 83R or the column decoder 83C. Meanwhile, the command signal input to the command address terminal T1 is supplied to a command decoder 82C via the command address input circuit 81. The command decoder 82C decodes the input command signal to generate various internal command signals. The internal command signals include, for example, an active signal ATS or a column signal CS.

The active signal ATS is activated when the command signal is an active command. When the active signal ATS is activated, the address signal AS is supplied from the address decoder 82A to the row decoder 83R. Therefore, the word line WL designated by the address signal AS is selected. The column signal CS is activated when the command signal is a read command or a write command. When the column signal CS is activated, the address signal AS is supplied from the address decoder 82A to the column decoder 83C. Therefore, the bit line BL designated by the address signal AS is selected.

Therefore, when the active command and the read command are input, the read data are read from the memory cell MC specified by the word line WL and the bit line BL designated by the address signal AS. The read data is output from the data terminal T3 to the outside via a read/write amplifier 84, an input/output circuit 85, and the data terminal T3. Meanwhile, when the active command and the write command are input and the write data is input to the data terminal T3, the write data is supplied and written with respect to the memory cell array MA specified by the word line WL and the bit line BL designated by the address signal AS, via the data terminal T3, the input/output circuit 85, and the read/write amplifier 15.

In the DRAM memory 80 described above, various circuit elements such as transistors that constitute the memory cell, the word lines WL, or the bit lines BL are periodically disposed in the memory cell array MA in the same circuit layout. As a result, also in the row decoder 83R to which each word line WL is connected, a unit pattern having the same shape by a plurality of word lines WL or other wirings is formed to be repeatedly arranged in one direction. The same applies to the column decoder 83C to which a plurality of bit lines BL is connected. The above-described circuit pattern 120 or the like may be applied to such row decoder 83R or the column decoder 83C.

Next, referring to FIG. 11, an image sensor 90 has a pixel array PA and a peripheral circuit. The peripheral circuit includes a row scanning circuit 91, a column processing circuit 92, a column scanning circuit 93, a system control unit 94, and a signal processor 96.

The pixel array PA has a plurality of pixels PXL. The pixels PXL are disposed in a two-dimensional grid pattern in the row direction and the column direction. Here, the row direction refers to a lateral direction in the drawing, and the column direction refers to a vertical direction in the drawing. Each pixel PXL has a photoelectric conversion element that generates and stores charges in accordance with the amount of received light. A predetermined filter may be provided in a light incident surface of each pixel PXL. Such filter may be, for example, a bayer filter.

In the pixel array PA, pixel drive lines PDL are commonly connected to the pixels PXL arranged in the row direction, and vertical signal lines VSL are commonly connected to the pixels PXL arranged in the column direction. One end of the pixel drive line PDL is connected to the row scanning circuit 91. The row scanning circuit 91 generates a drive signal to perform a signal reading driving from the pixel, and drives all the pixels PXL in the pixel array PA simultaneously, or row by row, via the pixel drive line PDL.

The signal output from the pixel PXL driven by the row scanning circuit 91 is input to the column processing circuit 92 via each vertical signal line VSL for each pixel PXL arranged in the row direction. The column processing circuit 92 may generate a pixel signal by performing a predetermined signal processing on the signal input via the vertical signal line VSL, and at the same time, temporarily hold the pixel signal. For example, the column processing circuit 92 performs, for example, a noise removing processing or an analog-digital conversion (AD conversion) processing. The digital signal obtained by the AD conversion is output to the signal processor 96. The column scanning circuit 93 sequentially selects reading circuits corresponding to the pixel column of the column processing circuit 92. The pixel signal that is signal processed for each pixel circuit in the column processing circuit 92 is sequentially output by the selective scanning of the column scanning circuit 93.

The system control unit 94 receives a system clock SYSCLK signal or the like via an external controller. The system control unit 94 includes a timing generator and the like, and drives the row scanning circuit 91, the column processing circuit 92, the column scanning circuit 93, and the like, based on various timing signals generated by the timing generator. The signal processor 96 has at least an arithmetic processing function, and performs various signal processings such as an arithmetic processing on the pixel signal output from the column processing circuit 92. The digital signal output from the signal processor 96 is output to an image processor, and the image processor performs a predetermined processing to generate an image signal to display an image on a predetermined display.

In the image sensor 90 configured described above, in the pixel array PA, various circuit elements such as a photodiode that constitutes the photoelectric conversion element, the pixel drive line PDL, and the vertical signal line VSL are periodically disposed in the same circuit layout. As a result, also in the row scanning circuit 91 to which each pixel drive line PDL is connected, a unit pattern having the same shape by a plurality of pixel drive lines PDL or other wirings is formed to be repeatedly arranged in one direction. The same also applies to the column processing circuit 92 to which a plurality of vertical signal lines VSL are connected. The above-described circuit pattern 120 or the like may be applied to such row scanning circuit 91 or the column processing circuit 92, and also the column scanning circuit 93 connected to the column processing circuit 92.

Not only in the NAND memory, the DRAM, and the imaging element described above, but also in a field programmable gate array (FPGA), a cross point memory, or the like, a circuit pattern formed by repeatedly arranging a unit pattern having the same shape in one direction may be provided. Further, even in the case of the semiconductor device having a circuit corresponding to one of the row decoder RD and the sense amplifier SA in the above-described NAND memory NM, the above-described circuit pattern 120 or the like may be applied to the circuit.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

In the specification, the particle PCL is illustrated as a defect, but the present disclosure is not limited thereto. For example, when specifying a defect such as breaking of wirings or short circuit that may occur during etching in a circuit pattern in which a unit pattern is repeatedly arranged, the circuit pattern according to the embodiment may be useful.

What is claimed is:

1. A semiconductor device comprising:
   a circuit pattern including a plurality of unit patterns that are disposed in a repeating manner in a first direction; and
   a discrimination pattern provided in the circuit pattern and configured to discriminate the plurality of unit patterns from each other,
   wherein the discrimination pattern has a corresponding one of a plurality of discrimination figures different from each other, and each of the plurality of discrimination figures corresponds to a respective one of the plurality of unit patterns,
   wherein the plurality of discrimination figures are arranged along a second direction, which is different from the first direction, and respective lengths of the plurality of discrimination figures in the second direction are different from each other.

2. The semiconductor device according to claim 1, wherein the plurality of discrimination figures include breaks, respectively, and locations of the breaks are different for each other across the plurality of discrimination figures.

3. The semiconductor device according to claim 1, wherein the plurality of unit patterns each extend in the second direction and is formed repeatedly in the first direction, and wherein short sides of the plurality of unit patterns exist in a same straight line extending in the first direction.

4. The semiconductor device according to claim 1, wherein the first direction is perpendicular to the second direction.

5. The semiconductor device according to claim 1, wherein each of the plurality of discrimination figures corresponds to a predetermined ratio of the plurality of unit patterns.

6. The semiconductor device according to claim 1, wherein gap regions exist between adjacent ones of the plurality of unit patterns, and the plurality of discrimination figures are disposed in the gap regions, respectively.

7. The semiconductor device according to claim 1, wherein the plurality of discrimination figures are spaced apart from the plurality of unit patterns.

8. The semiconductor device according to claim 1, wherein the circuit pattern and the discrimination pattern are provided in a same layer.

9. The semiconductor device according to claim 1, wherein the circuit pattern is a wiring made of a material, and the discrimination pattern is formed of the same material.

10. The semiconductor device according to claim 1, wherein the circuit pattern is a wiring, and the discrimination pattern is configured to modify the plurality of unit patterns.

11. The semiconductor device according to claim 1, wherein the circuit pattern is a groove or a hole, and the discrimination pattern is configured to modify the plurality of unit patterns.

12. The semiconductor device according to claim 1, further comprising:
   an additional discrimination pattern separated from the discrimination pattern with a predetermined interval.

* * * * *